(12) United States Patent
Takada

(10) Patent No.: US 9,171,807 B2
(45) Date of Patent: Oct. 27, 2015

(54) SEMICONDUCTOR DEVICE IN WHICH INTERNAL STRESS IN A LAYER IS RELAXED TO SUPPRESS WARPING

(71) Applicant: Kabushiki Kaisha Toshiba, Minato-ku (JP)

(72) Inventor: Yoshiharu Takada, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/026,003

(22) Filed: Sep. 13, 2013

(65) Prior Publication Data

US 2014/0097449 A1    Apr. 10, 2014

(30) Foreign Application Priority Data

Oct. 9, 2012 (JP) ................ 2012-224218

(51) Int. Cl.
 H01L 23/48 (2006.01)
 H01L 23/00 (2006.01)
 H01L 23/31 (2006.01)

(52) U.S. Cl.
 CPC .......... *H01L 23/562* (2013.01); *H01L 23/3192* (2013.01); *H01L 24/05* (2013.01); *H01L 2224/02166* (2013.01); *H01L 2924/1306* (2013.01)

(58) Field of Classification Search
 CPC .... H01L 23/562; H01L 24/05; H01L 23/3192
 USPC ......................................................... 257/178
 See application file for complete search history.

(56) References Cited

U.S. PATENT DOCUMENTS

| | | | | |
|---|---|---|---|---|
| 6,091,121 | A * | 7/2000 | Oda ............................... | 257/408 |
| 2005/0179116 | A1 * | 8/2005 | Rossi et al. .................... | 257/649 |
| 2007/0126036 | A1 * | 6/2007 | Ohta et al. ..................... | 257/288 |
| 2007/0259533 | A1 * | 11/2007 | Ahn et al. ...................... | 438/778 |
| 2010/0230761 | A1 * | 9/2010 | Yamaguchi et al. ........... | 257/369 |
| 2013/0009288 | A1 * | 1/2013 | Hu et al. ........................ | 257/649 |

FOREIGN PATENT DOCUMENTS

JP    2003-188060    7/2003

* cited by examiner

*Primary Examiner* — Minh-Loan Tran
*Assistant Examiner* — Farid Khan
(74) *Attorney, Agent, or Firm* — Oblon, McClelland, Maier & Neustadt, L.L.P.

(57) ABSTRACT

According to one embodiment, a semiconductor device includes a semiconductor layer, an electrode, and an insulating portion. The semiconductor layer has a first surface. The electrode is provided on the first surface of the semiconductor layer. The insulating portion includes a first layer and a second layer. The first layer covers the electrode on the first surface of the semiconductor layer and has a first internal stress along the first surface. The second layer is provided on the first layer and has a second internal stress in a reverse direction of the first internal stress.

7 Claims, 8 Drawing Sheets

US 9,171,807 B2

SEMICONDUCTOR DEVICE IN WHICH INTERNAL STRESS IN A LAYER IS RELAXED TO SUPPRESS WARPING

CROSS-REFERENCE TO RELATED APPLICATIONS

This application is based upon and claims the benefit of priority from Japanese Patent Application No. 2012-224218, filed on Oct. 9, 2012; the entire contents of which are incorporated herein by reference.

FIELD

Embodiments described herein relate generally to a semiconductor device.

BACKGROUND

A semiconductor device using a wide-gap semiconductor such as gallium nitride (GaN), silicon carbide (SiC), and diamond is more excellent in important characteristics such as breakdown voltage, electron mobility, and thermal conductivity than a semiconductor device using silicon (Si). Especially, in an HEMT (High Electron Mobility Transistor) having an AlGaN/GaN heterostructure as one form of a semiconductor device using GaN, an excellent radio frequency characteristic and low on-resistance can be achieved since the HEMT has high electron mobility and a high carrier density.

In such a wide-gap semiconductor, a substrate such as a wafer is used in which a wide-gap semiconductor is epitaxially grown on an Si substrate, which is inexpensive and easy to have a large diameter. In a case where a GaN-based material is to be epitaxially grown on an Si substrate, for example, lattice mismatch between Si and the GaN-based material is as much as 17 to 19%. When the lattice mismatch is large, a warping amount of the substrate increases.

In a semiconductor device, it is important to control warping of the substrate and improve a manufacturing yield.

DETAILED DESCRIPTION

Figure 1:
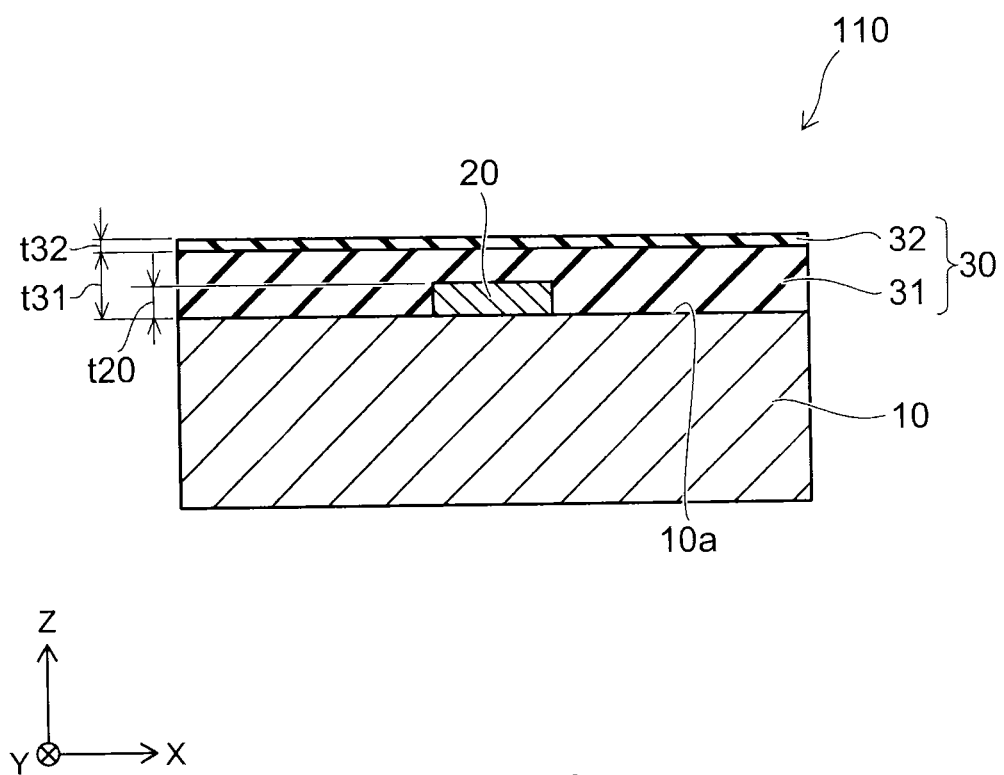
FIG. 1 is a schematic view illustrating the configuration of a semiconductor device according to a first embodiment.

According to one embodiment, a semiconductor device includes a semiconductor layer, an electrode, and an insulating portion. The semiconductor layer has a first surface. The electrode is provided on the first surface of the semiconductor layer. The insulating portion includes a first layer and a second layer. The first layer covers the electrode on the first surface of the semiconductor layer and has a first internal stress along the first surface. The second layer is provided on the first layer and has a second internal stress in a reverse direction of the first internal stress.

Various embodiments will be described hereinafter with reference to the accompanying drawings. It is to be noted that, in the following description, identical components in the drawings are shown with the same reference numerals, and description of the duplicate components is omitted as needed.

First Embodiment

FIG. 1 is a schematic view illustrating the configuration of a semiconductor device according to a first embodiment.

As shown in FIG. 1, a semiconductor device 110 according to the first embodiment includes a semiconductor layer 10, an electrode 20, and an insulating portion 30. The semiconductor device 110 is an electronic device (such as a diode, a transistor, a light-emitting element, a light-receiving element, a resistor, and a capacitor) including at least the semiconductor layer 10 and the electrode 20.

The semiconductor layer 10 has a first surface 10a. Examples of the semiconductor layer 10 include not only Si but also various semiconductors such as a nitride semiconductor such as GaN, SiC, gallium arsenic (GaAs), indium phosphorus (InP), indium gallium phosphorus (InGaP), indium arsenide (InAs), and indium gallium arsenic (InGaAs).

The electrode 20 is provided on the first surface 10a of the semiconductor layer 10. In the embodiment, a direction connecting the semiconductor layer 10 with the electrode 20 is referred to as a Z-direction, one of directions perpendicular to the Z-direction is referred to as an X-direction, and a direction perpendicular to the Z-direction and the X-direction is referred to as a Y-direction. Further, in the embodiment, a direction in the Z-direction from the semiconductor layer 10 toward the electrode 20 is referred to as an upward direction while an opposite direction is referred to as a downward direction.

The electrode 20 is provided to contact a part of the first surface 10a, for example. The electrode 20 may be provided via a film provided on the first surface 10a. The electrode 20 extends in the Y-direction, for example. Ni is used for the electrode 20, for example.

The insulating portion 30 has a first layer 31 and a second layer 32. The first layer 31 is provided on the first surface 10a of the semiconductor layer 10 so as to cover the electrode 20. The first layer 31 is a protective layer of the electrode 20. A thickness t31 of the first layer 31 is thicker than a thickness t20 of the electrode 20. An upper surface and respective side surfaces of the electrode 20 are covered with the first layer 31.

For the first layer 31, at least one of silicon nitride (SiN), silicon oxide ($SiO_2$), and silicon oxynitride (SiON) is used, for example. The thickness t31 of the first layer 31 is approximately 0.2 micrometers (μm) or more and 0.3 μm or less, for example, although the thickness t31 differs with the thickness t20 and a material of the electrode 20. The first layer 31 has first internal stress along the first surface 10a. The first internal stress is tensile stress or compressive stress, for example.

The second layer 32 is provided on the first layer 31. The second layer 32 contacts the first layer 31. For the second layer 32, at least one of SiN, $SiO_2$, and SiON is used, for example. The second layer 32 has a thickness t32. The second layer 32 has second internal stress in a reverse direction of the first internal stress of the first layer 31. In a case where the first internal stress is tensile stress, the second internal stress is compressive stress. In a case where the first internal stress is compressive stress, the second internal stress is tensile stress. That is, the second layer 32 is a stress relaxation layer relaxing the first internal stress contained in the first layer 31.

A magnitude of force (internal force) acting in the second layer 32 is set by at least one of the thickness t32, a material, an additive, and a manufacturing method of the second layer 32, for example. That is, the magnitude of the internal force in the second layer 32 is adjusted by the thickness t32, for example. Further, by setting a material composition of the second layer 32 to be different from a material composition of the first layer 31, the second internal stress in a reverse direction of the first internal stress is obtained.

Further, even in a case where the material composition of the second layer 32 is the same as the material composition of the first layer 31, the second internal stress in a reverse direction of the first internal stress is obtained depending on a material and an amount of the additive included in the second layer 32. Further, the magnitude of the second internal stress is adjusted by the material and the amount of the additive included in the second layer 32.

Further, by the manufacturing method of the second layer 32 as well, the second internal stress in a reverse direction of the first internal stress is obtained, and the magnitude of the second internal stress is adjusted. For example, even in a case where the material of the first layer 31 and the material of the second layer 32 are the same, the second internal stress with predetermined magnitude is obtained by forming the second layer 32 in a different manufacturing method from a manufacturing method of the first layer 31. Further, even in a case where the manufacturing method of the first layer 31 and the manufacturing method of the second layer 32 are the same, the second internal stress with predetermined magnitude is obtained by forming the second layer 32 under different manufacturing conditions from manufacturing conditions of the first layer 31.

The thickness t32 of the second layer 32 is thinner than the thickness t31 of the first layer 31, for example. The thickness t32 of the second layer 32 is a fraction of the thickness t31 such as approximately 0.05 μm, although the thickness t32 differs with a magnitude of the first internal stress and the material. When the thickness t32 is thinner than the thickness t31, a process condition for the first layer 31 has only to be determined mainly as a process condition for the insulating portion 30.

The first internal stress of the first layer 31 and the second internal stress of the second layer 32 are measured by an X-ray diffraction method, for example. For example, a layer under measurement of internal stress is irradiated with an X-ray at a predetermined angle to derive a Bragg angle θ. Lattice spacing is then derived from the Bragg angle θ, and the internal stress is derived from a difference between standard lattice spacing for the material and the derived lattice spacing, Young's modulus, and Poisson's ratio.

The first internal stress and the second internal stress may be measured by an electron backscatter diffraction method as well. In the electron backscatter diffraction method, a layer under measurement of internal stress is irradiated with an electron beam at a predetermined angle. Subsequently, a diffraction electron beam on a crystal plane at an approximately 50 nm or less region below the surface irradiated with the electron beam is obtained. By analyzing this diffraction electron beam, lattice strain is measured, and the internal stress is derived.

The first internal stress and the second internal stress may be measured by an electron diffraction method as well. In the electron diffraction method, a layer under measurement of internal stress is irradiated with an electron beam at a predetermined angle. Subsequently, lattice spacing is measured from obtained diffraction spots. Lattice strain is measured from changes of the measured lattice spacing from reference lattice spacing to derive the internal stress.

In the semiconductor device 110, the first internal stress of the first layer 31 covering the electrode 20 is relaxed by the second internal stress of the second layer 32. In a case where the thickness t32 of the second layer 32 is thinner than the thickness t31 of the first layer 31, the second internal stress is larger than the first internal stress. Thus, warping of the semiconductor layer 10 caused by the first internal stress is suppressed. Accordingly, in a manufacturing process after formation of the insulating portion 30, reduction in manufacturing yield caused by warping of the semiconductor layer 10 is suppressed. For example, suppression of warping of the semiconductor layer 10 suppresses exposure deviation caused by warping in a photolithography process after formation of the insulating portion 30. Thus, high-accuracy photolithography is performed, causing manufacturing yield to be improved.

Figure 2A:
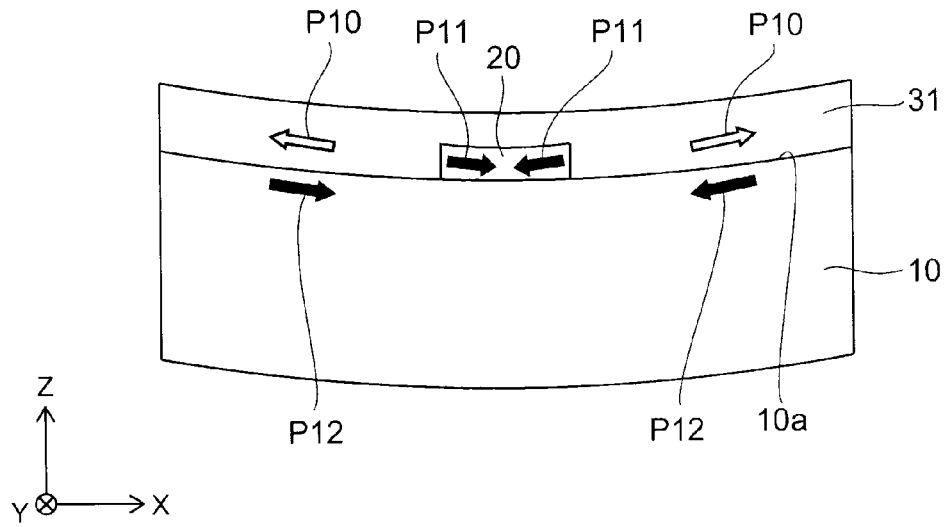
FIG. 2A and FIG. 2B are schematic views illustrating warping.
Figure 2B:
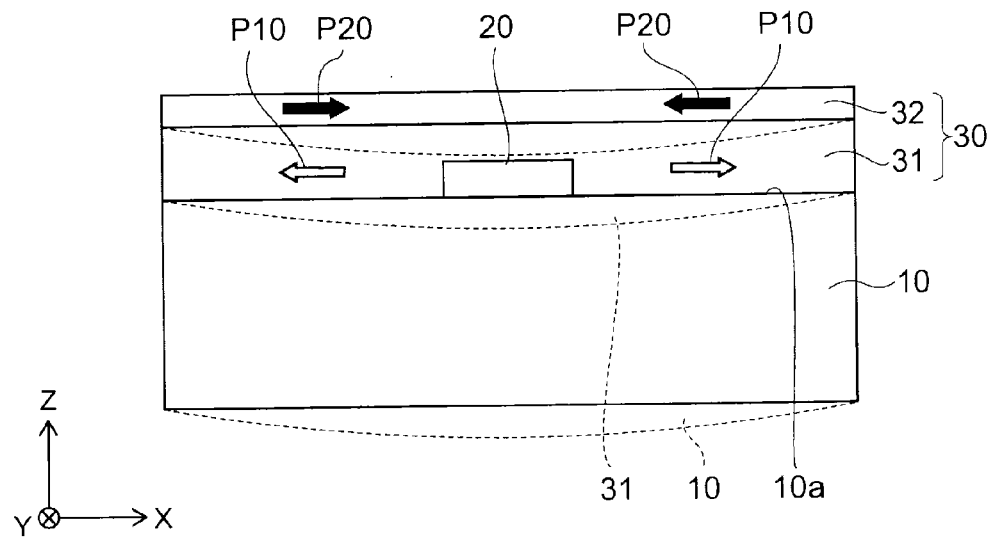

FIGS. 2A and 2B are schematic views illustrating warping.

FIG. 2A schematically shows a state of warping when the first layer 31 is formed on the first surface 10a of the semiconductor layer 10. FIG. 2B schematically shows a state of warping when the second layer 32 is formed on the first layer 31.

As shown in FIG. 2A, when the first layer 31 is formed on the first surface 10a of the semiconductor layer 10, warping is generated in the semiconductor layer 10 due to first internal stress P10 of the first layer 31. In the example shown in FIG. 2A, the first internal stress P10 is tensile stress in an X-direction. Due to the first internal stress P10, which is tensile stress, the electrode 20 covered with the first layer 31 receives stress P11, which is compressive stress. Further, in an internal portion of the semiconductor layer 10 facing the first surface 10a, stress P12, which is compressive stress opposing the first internal stress P10, is generated. Thus, the semiconductor layer 10 warps in an upward recess shape.

When the second layer 32 is formed on the first layer 31 as shown in FIG. 2B, the first internal stress P10 of the first layer 31 is relaxed by second internal stress P20 of the second layer 32. In the example shown in FIG. 2B, the second internal stress P20 is compressive stress in the X-direction. The first internal stress P10 is relaxed by this second internal stress P20, and warping of the semiconductor layer 10 warping in the upward recess shape is suppressed.

For example, in a case where a transistor is manufactured by epitaxially growing the semiconductor layer 10 including a GaN-based material on an Si substrate, the semiconductor layer 10 having a thickness of 3 μm or more is normally formed on the substrate to obtain high-quality crystals of the semiconductor layer 10 and to increase breakdown voltage in a vertical direction of the substrate. When such a thick semiconductor layer 10 is formed, the substrate warps in an upward recess shape.

In a case where a device is manufactured on a substrate having a large warping amount as in the above case, forming a thick interlayer insulating film between interconnects in a manufacturing procedure may further increase warping of the substrate, for example. When the warping amount of the substrate varies, reliable carriage and reliable holding become difficult in a carrying system and a vacuum-chuck system of a manufacturing apparatus depending on the variation amount, which causes reduction in manufacturing yield.

In the embodiment, since variation in the warping amount during the process is suppressed by the insulating portion 30 to be formed on the semiconductor layer 10, reduction in yield caused by warping is suppressed.

Meanwhile, although a case in which the first internal stress P10 is tensile stress has been illustrated in the examples shown in FIGS. 2A and 2B, the same is true of a case in which the first internal stress P10 is compressive stress. In a case where the first internal stress P10 is compressive stress, the stress P11, which is tensile stress, is applied to the electrode 20, and the stress P12, which is tensile stress, is generated in an internal portion of the semiconductor layer 10 facing the first surface 10a. Thus, the semiconductor layer 10 warps in an upward protrusion shape. In this case, the second layer 32 having the second internal stress P20, which is compressive stress, is formed on the first layer 31. Consequently, warping of the semiconductor layer 10 warping in the upward protrusion shape is suppressed.

When warping of the semiconductor layer 10 is suppressed in this manner, accuracy in process of the insulating portion 30 and formation of a film to be formed on the insulating portion 30 is improved. This improves manufacturing yield of the semiconductor device 110.

Meanwhile, there is a case in which warping is generated in the semiconductor layer 10 after formation of the semiconductor layer 10. Generation of warping in the semiconductor layer 10 is acceptable as long as the warping is in an allowable range for the manufacturing apparatus. On the other hand, there is a case in which warping goes over the allowable range for the manufacturing apparatus when the first layer 31 is formed on the semiconductor layer 10 in which warping is generated. The second layer 32 has only to have the second internal stress P20 that keeps the warping of the semiconductor layer 10 in the allowable range for the manufacturing apparatus. Consequently, variation in the warping amount of the semiconductor layer 10 is suppressed, which enables the process to be performed in the warping amount in the allowable range for the manufacturing apparatus.

Second Embodiment

Figure 3:
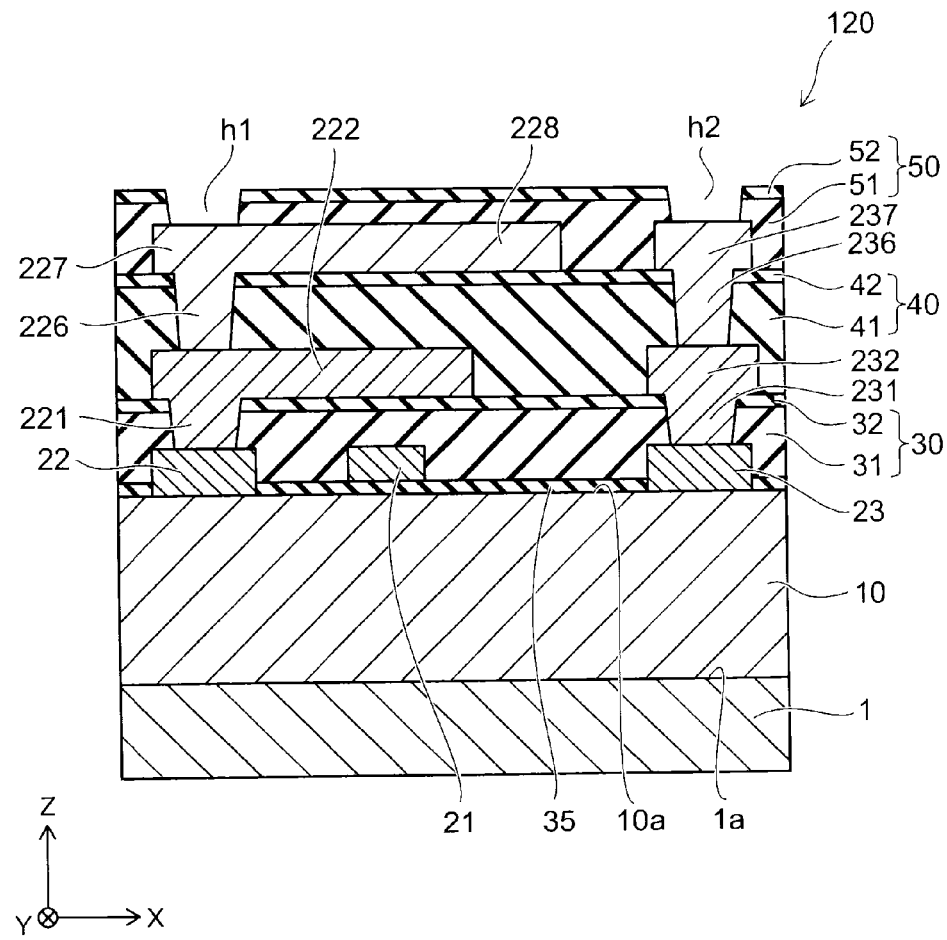
FIG. 3 is a schematic cross-sectional view illustrating the configuration of a semiconductor device according to a second embodiment.

FIG. 3 is a schematic cross-sectional view illustrating the configuration of a semiconductor device according to a second embodiment.

Figure 4:
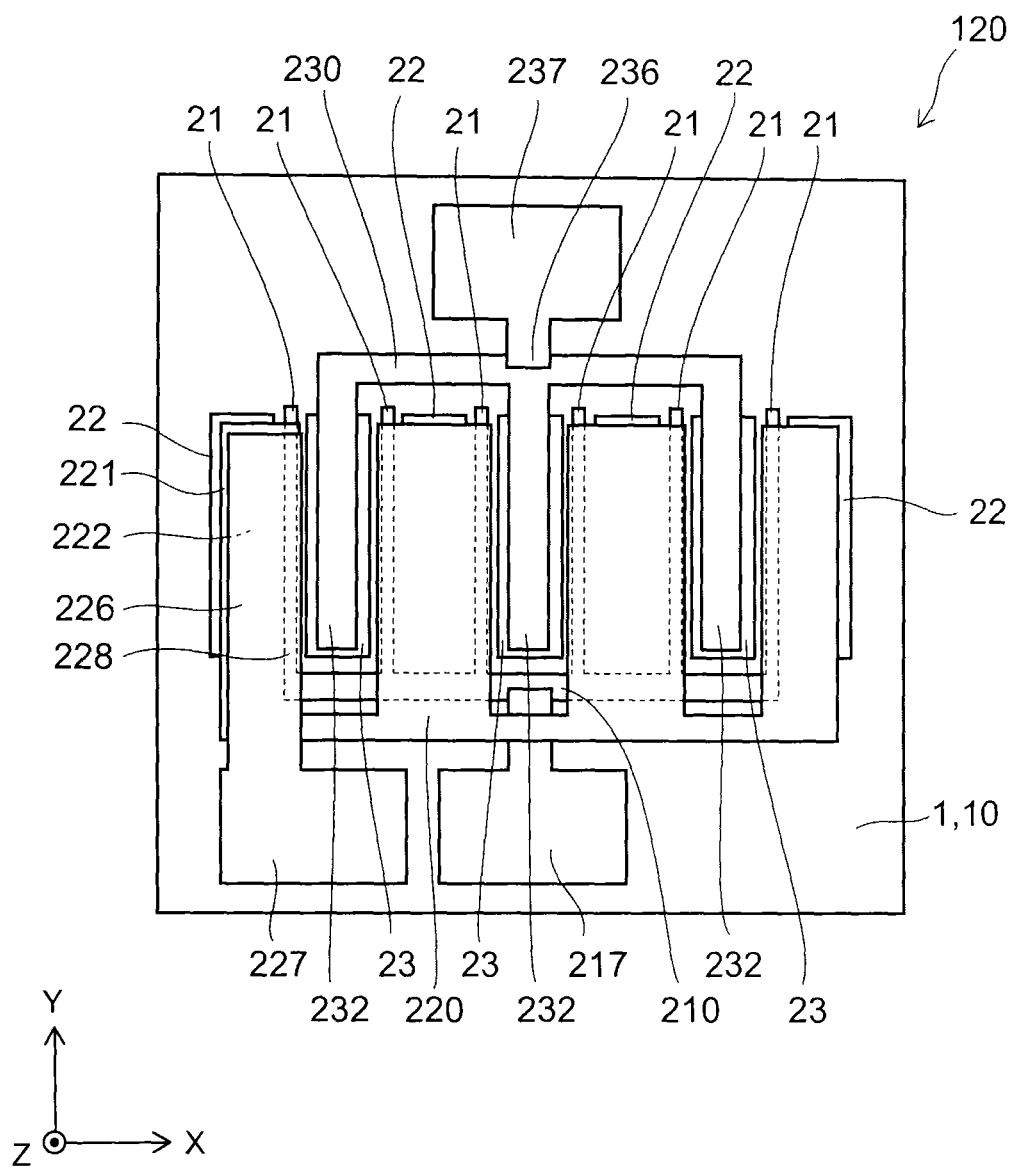
FIG. 4 is a schematic plan view illustrating the configuration of the semiconductor device according to the second embodiment.

FIG. 4 is a schematic plan view illustrating the configuration of the semiconductor device according to the second embodiment.

As shown in FIG. 3 and FIG. 4, a semiconductor device 120 according to the second embodiment is an FET (Field Effect Transistor), for example.

As shown in FIG. 3, the semiconductor device 120 includes the semiconductor layer 10 provided on an upper surface 1a of an Si substrate 1, for example. The semiconductor layer 10 has a heterojunction structure of GaN and AlGaN epitaxially grown on the upper surface is of the substrate 1, for example. For example, GaN is epitaxially grown on the upper surface 1a of the substrate 1, and AlGaN is epitaxially grown on GaN.

On the first surface 10a of the semiconductor layer 10, a gate insulating film 35 is provided. For the gate insulating film 35, SiN, AlN, or $SiO_2$ is used, for example. On the gate insulating film 35, a gate electrode 21 is provided. The gate electrode 21 is provided on AlGaN of the semiconductor layer 10 via the gate insulating film 35. At parts on the first surface 10a of the semiconductor layer 10 provided with no gate insulating film 35, a source electrode 22 and a drain electrode 23 are provided. The source electrode 22 and the drain electrode 23 are provided to contact the first surface 10a exposed by removing parts of the gate insulating film 35. The source electrode 22 and the drain electrode 23 are in ohmic contact with AlGaN of the semiconductor layer 10. The semiconductor device 120 is an MIS-type GaN-based HEMT.

As shown in FIG. 4, in the semiconductor device 120, a plurality of gate electrodes 21, source electrodes 22, and drain electrodes 23 are provided, respectively. The plurality of gate electrodes 21, the plurality of source electrodes 22, and the plurality of drain electrodes 23 are disposed spaced from each other in the X-direction and parallel to each other.

The respective source electrodes 22 and the respective drain electrodes 23 are disposed alternately in the X-direction. The respective gate electrodes 21 are disposed between the source electrodes 22 and the drain electrodes 23 disposed alternately. That is, an electrode structure of the semiconductor device 120 is a multifinger structure.

Each one end of the plurality of gate electrodes 21 is provided with a connecting interconnect 210. Thereby, the plurality of gate electrodes 21 is provided in a comb-like shape.

On the gate electrodes 21, the source electrodes 22, and the drain electrodes 23 is provided the insulating portion 30 (first insulating portion) to cover these electrodes. The insulating portion 30 has the first layer 31 and the second layer 32 described above. Thus, warping of the semiconductor layer 10 caused by the first internal stress of the first layer 31 is suppressed by the second internal stress of the second layer 32.

Each of the plurality of source electrodes 22 is connected to an extending electrode 222 via a contact 221. The extending electrode 222 is provided on the insulating portion 30. The contact 221 pierces the insulating portion 30 and connects the source electrode 22 to the extending electrode 222. The extending electrode 222 is provided to cover an area from the contact 221 to an upper side of the gate electrode 21. The extending electrode 222 functions as a field plate electrode to the gate electrode 21.

A plurality of extending electrodes 222 is provided. Each one end of the plurality of extending electrodes 222 is provided with a connecting interconnect 220. Thereby, the plurality of extending electrodes 222 is provided in a comb-like shape.

Each of the plurality of drain electrodes 23 is connected to a routing electrode 232 via a contact 231. The routing electrode 232 is provided on the insulating portion 30. The contact 231 pierces the insulating portion 30 and connects the drain electrode 23 to the routing electrode 232.

A plurality of routing electrodes 232 are provided. Each one end of the plurality of routing electrodes 232 is provided with a connecting interconnect 230. Thereby, the plurality of routing electrodes 232 are provided in a comb-like shape. As viewed in a Z-direction, the plurality of routing electrodes 232 oppose a plurality of gate electrodes 21. The plurality of the routing electrodes 232 are provided with the plurality of the gate electrodes 21 alternately.

Further, as viewed in the Z-direction, the plurality of routing electrodes 232 oppose the plurality of the extending electrodes 222. The plurality of the routing electrodes 232 are provided with the plurality of the extending electrodes 222 alternately.

On the extending electrodes 222 and the routing electrodes 232, an insulating portion 40 (second insulating portion) is provided to cover these electrodes. The insulating portion 40 has a third layer 41 and a fourth layer 42 which are similar to the aforementioned first layer 31 and second layer 32. Internal stress of the fourth layer 42 is in a reverse direction of internal stress of the third layer 41. Thereby, warping of the semiconductor layer 10 caused by the internal stress of the third layer 41 is suppressed by the internal stress of the fourth layer 42.

The extending electrodes 222 are connected to a source pad 227 via a contact 226. The source pad 227 is provided on the insulating portion 40. The contact 226 pierces the insulating portion 40 and connects the extending electrodes 222 to the source pad 227. An interconnect 228 between the contact 226 and the source pad 227 may be provided to cover an upper side of the gate electrode 21. Thereby, the interconnect 228 functions as a field plate electrode to the gate electrode 21.

The routing electrodes 232 are connected to a drain pad 237 via a contact 236. The drain pad 237 is provided on the insulating portion 40. The contact 236 pierces the insulating portion 40 and connects the routing electrodes 232 to the drain pad 237.

On the source pad 227, the interconnect 228, and the drain pad 237, an insulating portion 50 (third insulating portion) is provided to cover these. The insulating portion 50 has a fifth layer 51 and a sixth layer 52 which are similar to the aforementioned first layer 31 and second layer 32. Internal stress of the sixth layer 52 is in a reverse direction of internal stress of the fifth layer 51. Thereby, warping of the semiconductor layer 10 caused by the internal stress of the fifth layer 51 is suppressed by the internal stress of the sixth layer 52.

In the insulating portion 50 on the source pad 227, an opening h1 is provided. Further, in the insulating portion 50 on the drain pad 237, an opening h2 is provided. To the source pad 227 exposed from the opening h1 is connected a not-shown bonding wire to obtain conduction between the source electrodes 22 and an external circuit. To the drain pad 237 exposed from the opening h2, a not-shown bonding wire is connected to obtain conduction between the drain electrodes 23 and an external circuit.

Further, to the connecting interconnect 210 connected to the gate electrodes 21, a gate pad 217 is connected. To the gate pad 217, a not-shown bonding wire is connected to obtain conduction between the gate electrodes 21 and an external circuit.

In such a semiconductor device 120, the insulating portions 30, 40, and 50 are provided on the semiconductor layer 10 in a plurality of layers. The respective insulating portions 30, 40, and 50 is provided with stress relaxation layers (the second layer 32, the fourth layer 42, and the sixth layer 52). As a number of layers of the insulators increases, warping is generated in the semiconductor layer 10 more easily. Thus, by providing the respective stress relaxation layers in the insulating portions in the respective layers, variation in the warping amount of the semiconductor layer 10 is suppressed effectively. When variation in the warping amount of the semiconductor layer 10 is suppressed, alignment accuracy and the like when multilayered insulating portions and interconnects are formed on the semiconductor layer 10 are improved. Accordingly, manufacturing yield of the semiconductor device 120 is improved.

Although the semiconductor device 120 shown in FIG. 3 and FIG. 4 including the insulating portions 30, 40, and 50 in three layers has been illustrated, the same is true of a semiconductor device including insulating portions in two or more layers.

Next, a method for manufacturing the semiconductor device 120 will be described.

FIG. 5A to FIG. 7B are schematic cross-sectional views describing the method for manufacturing the semiconductor device.

Figure 5A:
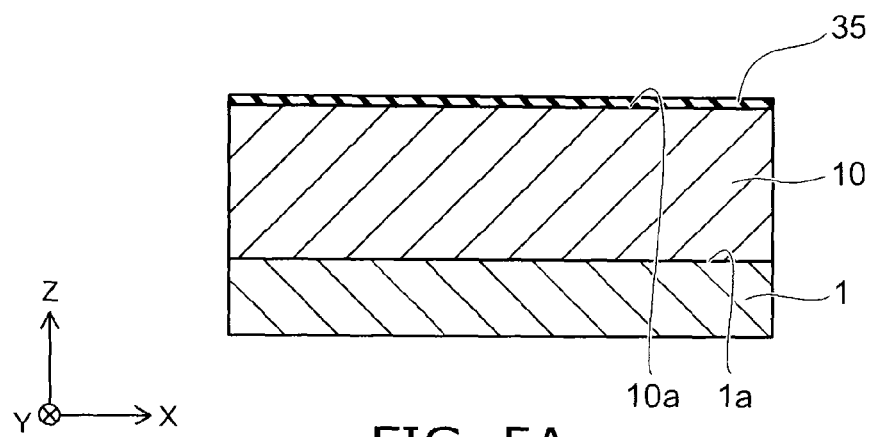
FIG. 5A to FIG. 7B are schematic cross-sectional views describing a method for manufacturing the semiconductor device.

First, as shown in FIG. 5A, the substrate 1 is prepared. For the substrate 1, Si, SiC, sapphire, or GaN is used, for example. A material for the substrate 1 is selected based on a material for the semiconductor layer 10 to be formed on the substrate 1, for example. In the embodiment, an example of using the Si substrate 1 is described.

Subsequently, the semiconductor layer 10 is formed on the upper surface 1a of the substrate 1. In the embodiment, the semiconductor layer 10 includes GaN and AlGaN. For example, a buffer layer is grown on the upper surface 1a of the substrate 1, on which GaN is epitaxially grown, on which AlGaN is epitaxially grown. For the epitaxial growth, an LPE (Liquid Phase Epitaxy) method, an HVPE (Hydride Vapor Phase Epitaxy) method, an MOCVD (Metal Organic Chemical Vapor Deposition) method, or an MBE (Molecular Beam Epitaxy) method is used, for example. A thickness of GaN is 3 micrometers (μm), for example. A thickness of AlGaN is 30 nm, for example.

Subsequently, the gate insulating film 35 is formed on the first surface 10a of the semiconductor layer 10. The gate insulating film 35 is formed by CVD (Chemical Vapor Deposition), for example. A material for the gate insulating film 35 includes SiN, AlN, and $SiO_2$, for example. A thickness of the gate insulating film 35 is 20 nm, for example.

Figure 5B:
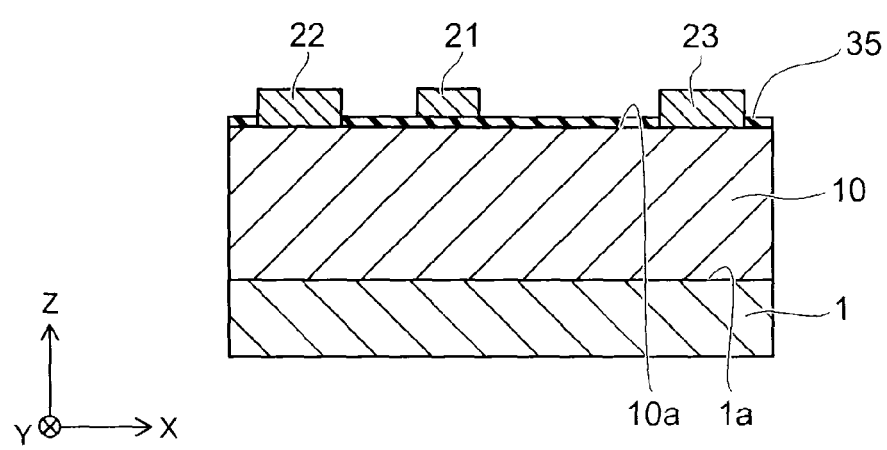

Subsequently, as shown in FIG. 5B, parts of the gate insulating film 35 are etched and removed to expose the semiconductor layer 10. At the parts from which the semiconductor layer 10 is exposed, the source electrode 22 and the drain electrode 23 are formed. Further, the gate electrode 21 is formed on the gate insulating film 35. A material for the gate electrode 21 is Ni, for example. Materials for the source electrode 22 and the drain electrode 23 are stacked Ti and Al, for example.

The gate electrode 21, the source electrode 22, and the drain electrode 23 are formed by a vacuum deposition method or a sputtering method, for example. A thickness of the gate electrode 21 is 0.2 μm, for example, a thickness of the source electrode 22 is 0.2 μm, for example, and a thickness of the drain electrode 23 is 0.2 μm, for example.

Figure 5C:
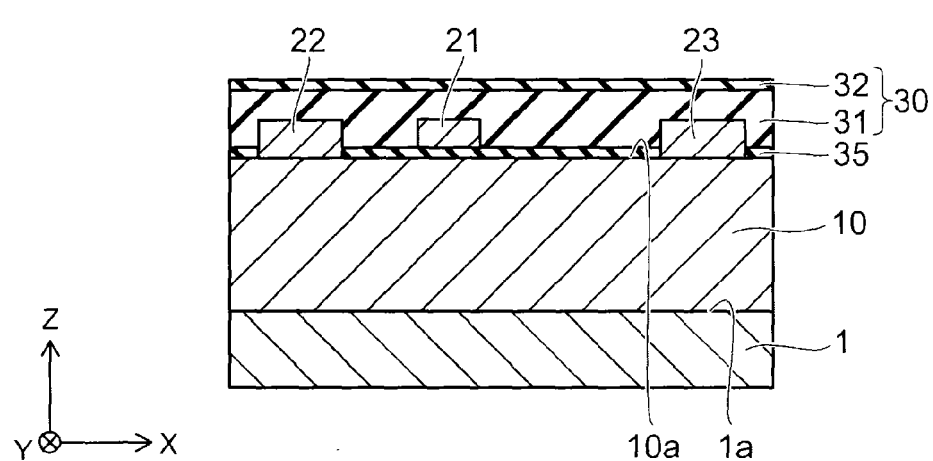

Subsequently, as shown in FIG. 5C, the insulating portion is formed to cover the gate electrode 21, the source electrode 22, and the drain electrode 23. First, the first layer 31 is formed to cover the gate electrode 21, the source electrode 22, and the drain electrode 23. Thereafter, the second layer 32 is formed on the first layer 31.

A material for the first layer 31 is SiN, for example. The first layer 31 is formed by plasma CVD, for example. In an example of film forming conditions for the first layer 31 by the plasma CVD, $SiH_4$, $NH_3$, and $N_2$ are used for material gas. Pressure is 80 Pascal (Pa), discharge voltage is 50 watt (W), and a film forming temperature is 375° C. A thickness of the first layer 31 is approximately 0.2 μm or more and 0.3 μm or less, for example. Thus, the first internal stress is contained in the first layer 31.

Here, in a case where the first surface 10a of the semiconductor layer 10 is a surface parallel to c plane (0001) of GaN, the first internal stress is tensile stress. When the first layer 31 containing tensile stress is formed, compressive stress is given to the gate electrode 21. When the compressive stress is given to the gate electrode 21, piezo charge is generated in the semiconductor layer 10 around an end of the gate electrode 21. Electric field concentration around the end of the gate electrode 21 is alleviated by this piezo charge, and breakdown voltage is improved.

On the other hand, when large tensile stress is contained in the first layer 31, significant warping may be generated in the semiconductor layer 10. To cope with this, the second layer 32 having the second stress in a reverse direction of the first internal stress is formed on the first layer 31.

A material for the second layer 32 is SiN, for example. The second layer 32 is formed by a sputtering method, for example. In film forming conditions for the second layer 32 by the sputtering method, Si as a target material is sputtered by $N_2$ plasma, for example. A thickness of the second layer 32 is approximately 0.05 μm, for example. Depending on a material, a manufacturing method, a thickness, and the like of the second layer 32, the second internal stress in a reverse direction of the first internal stress in the first layer 31 is contained in the second layer 32.

By providing the insulating portion 30 including the first layer 31 and the second layer 32, warping of the semiconductor layer 10 is suppressed further than in a case of providing only the first layer 31.

Figure 6A:
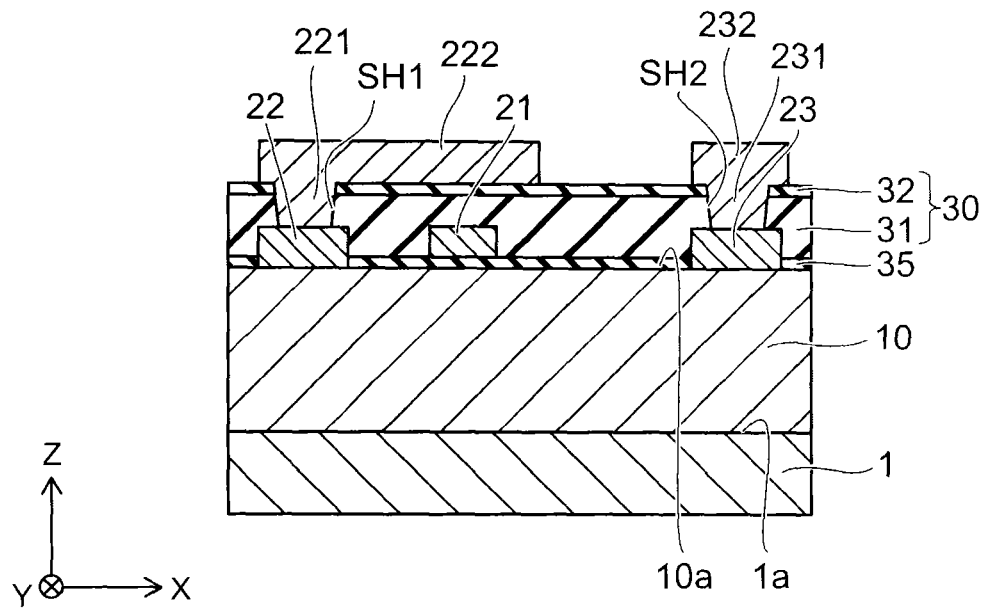

Subsequently, as shown in FIG. 6A, a hole SH1 is formed in the insulating portion 30 on the source electrode 22, and a hole SH2 is formed in the insulating portion 30 on the drain electrode 23. The hole SH1 pierces the second layer 32 to the first layer 31 of the insulating portion 30 and reaches a surface of the source electrode 22. The hole SH2 pierces the second layer 32 to the first layer 31 of the insulating portion 30 and reaches a surface of the drain electrode 23.

The holes SH1 and SH2 are formed by wet etching or dry etching. When a thickness of the second layer 32 is sufficiently thinner than a thickness of the first layer 31, an etching condition for the first layer 31 has only to be adjusted mainly as an etching condition for formation of the holes SH1 and SH2. That is, etching of the insulating portion 30 is performed with little consideration of an etching condition for the second layer 32. For example, an optimal etching condition for the first layer 31 has only to be applied, and etching time has only to be extended in accordance with the thickness of the second layer 32.

Subsequently, the contact 221 is formed in the hole SH1, and the extending electrode 222 connected to the contact 221 and extending along an upper surface of the insulating portion 30 is formed. Further, the contact 231 is formed in the hole SH2, and the routing electrode 232 connected to the contact 231 is formed. To form the contact 221, the contact 231, the extending electrode 222, and the routing electrode 232, a conductive material is first formed on an entire surface of the upper surface of the insulating portion 30. At this time, the conductive material buried in the hole SH1 becomes the contact 221 while the conductive material buried in the hole SH2 becomes the contact 231. Thereafter, the conductive material is patterned to form the extending electrode 222 and the routing electrode 232.

Figure 6B:
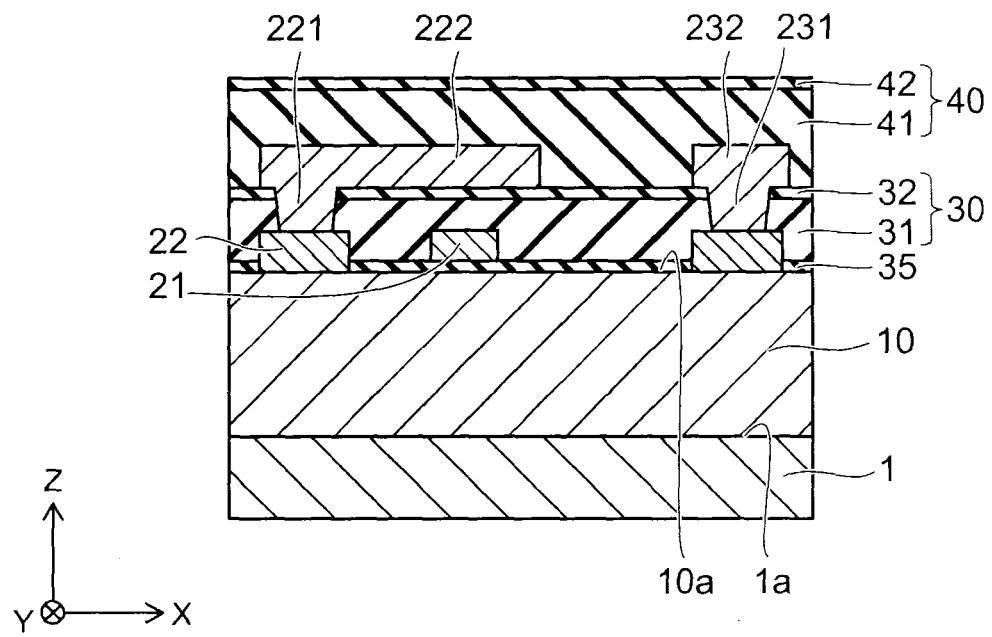

Subsequently, as shown in FIG. 6B, the insulating portion 40 is formed to cover the extending electrode 222 and the routing electrode 232. First, the third layer 41 is formed to cover the extending electrode 222 and the routing electrode 232. Thereafter, the fourth layer 42 is formed on the third layer 41.

A material for the third layer 41 is $SiO_2$, for example. The third layer 41 is formed by plasma CVD, for example. In an example of film forming conditions for the third layer 41 by the plasma CVD, $SiH_4$, $N_2O$, and $N_2$ are used for material gas. Pressure is 80 Pa, discharge voltage is 50 W, and a film forming temperature is 350° C. A thickness of the third layer 41 is approximately 0.2 μm or more and 0.8 μm or less, for example. Thus, third internal stress is contained in the third layer 41.

A material for the fourth layer 42 is SiN, for example. The fourth layer 42 is formed by a sputtering method, for example. In film forming conditions for the fourth layer 42 by the sputtering method, Si as a target material is sputtered by $N_2$ plasma, for example. A thickness of the fourth layer 42 is approximately 0.05 μm, for example. Depending on a material, a manufacturing method, a thickness, and the like of the fourth layer 42, fourth internal stress in a reverse direction of the third internal stress in the third layer 41 is contained in the fourth layer 42.

By providing the insulating portion 40 including the third layer 41 and the fourth layer 42, warping of the semiconductor layer 10 is suppressed further than in a case of providing only the third layer 41.

Figure 7A:
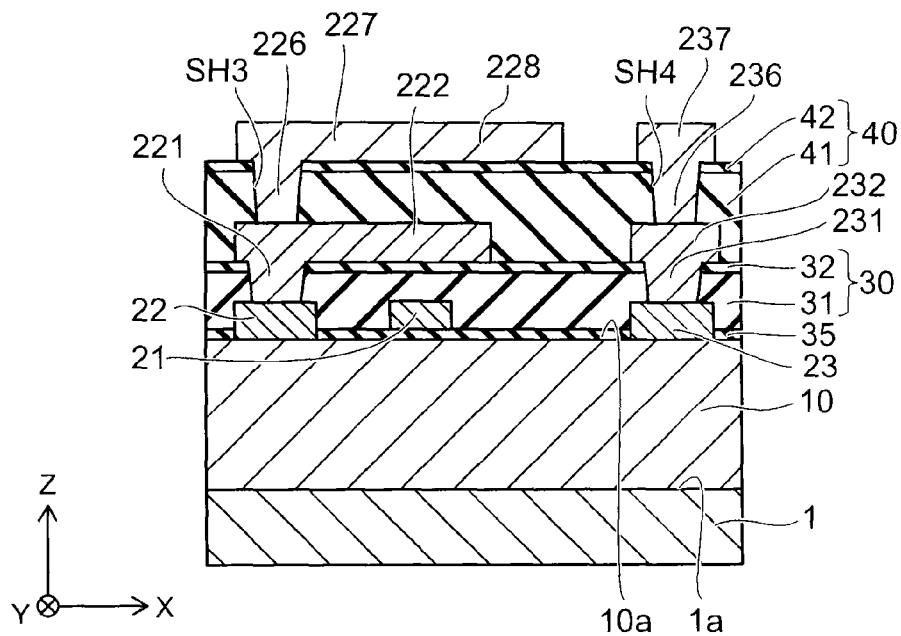

Subsequently, as shown in FIG. 7A, a hole SH3 is formed in the insulating portion 40 on the extending electrode 222, and a hole SH4 is formed in the insulating portion 40 on the routing electrode 232. The hole SH3 pierces the fourth layer 42 to the third layer 41 of the insulating portion 40 and reaches a surface of the extending electrode 222. The hole SH4 pierces the fourth layer 42 to the third layer 41 of the insulating portion 40 and reaches a surface of the routing electrode 232.

When a thickness of the fourth layer 42 is sufficiently thinner than a thickness of the third layer 41, an etching condition for the third layer 41 has only to be adjusted mainly in formation of the holes SH3 and SH4.

Subsequently, the contact 226 is formed in the hole SH3, and the interconnect 228 and the source pad 227 connected to the contact 226 and extending along an upper surface of the insulating portion 40 is formed. Further, the contact 236 is formed in the hole SH4, and the drain pad 237 connected to the contact 236 is formed. To form the contact 226, the contact 236, the interconnect 228, the source pad 227, and the drain pad 237, a conductive material is first formed on an entire surface of the upper surface of the insulating portion 40. At this time, the conductive material buried in the hole SH3 becomes the contact 226 while the conductive material buried in the hole SH4 becomes the contact 236. Thereafter, the conductive material is patterned to form the interconnect 228, the source pad 227, and the drain pad 237.

Figure 7B:
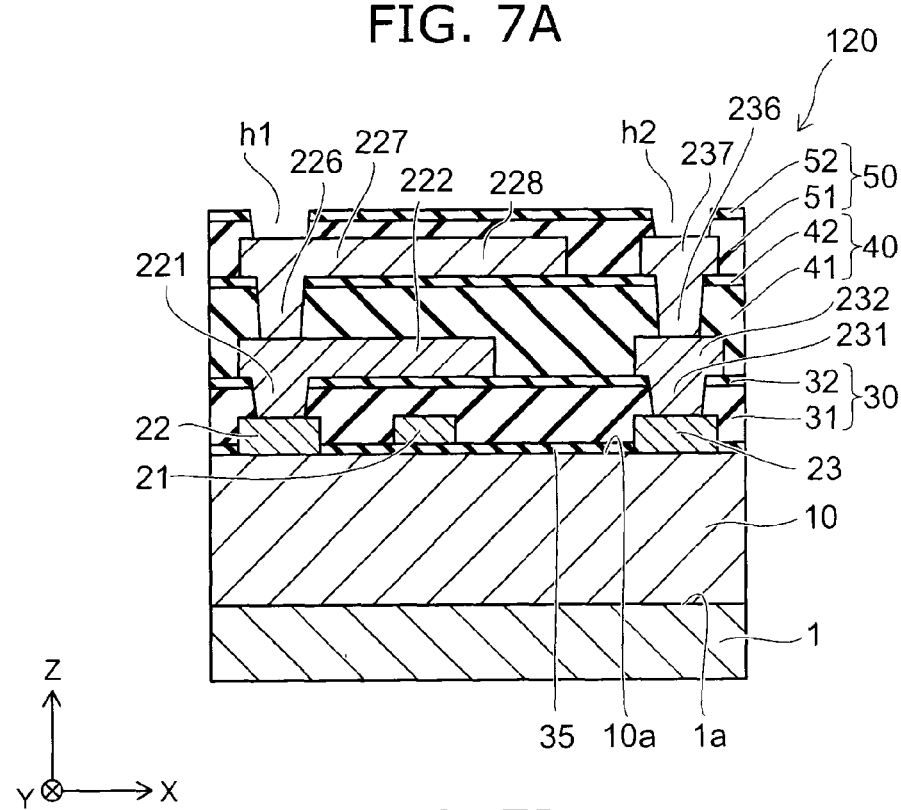

Subsequently, as shown in FIG. 7B, the insulating portion 50 is formed to cover the interconnect 228, the source pad 227, and the drain pad 237. First, the fifth layer 51 is formed to cover the interconnect 228, the source pad 227, and the drain pad 237. Thereafter, the sixth layer 52 is formed on the fifth layer 51.

A material for the fifth layer 51 is SiN, for example. The fifth layer 51 is formed by plasma CVD, for example. In an example of film forming conditions for the fifth layer 51 by the plasma CVD, $SiH_4$, $NH_3$, and $N_2$ are used for material gas. Pressure is 80 Pa, discharge voltage is 50 W, and a film forming temperature is 375° C. A thickness of the fifth layer 51 is approximately 0.1 μm or more and 0.3 μm or less, for example. Thus, fifth internal stress is contained in the fifth layer 51.

A material for the sixth layer 52 is SiN, for example. The sixth layer 52 is formed by a sputtering method, for example. In film forming conditions for the sixth layer 52 by the sputtering method, Si as a target material is sputtered by $N_2$ plasma, for example. A thickness of the sixth layer 52 is approximately 0.05 for example. Depending on a material, a manufacturing method, a thickness, and the like of the sixth layer 52, sixth internal stress in a reverse direction of the fifth internal stress in the fifth layer 51 is contained in the sixth layer 52.

By providing the insulating portion 50 including the fifth layer 51 and the sixth layer 52, warping of the semiconductor layer 10 is suppressed further than in a case of providing only the fifth layer 51.

Subsequently, the opening h1 is formed in the insulating portion 50 on the source pad 227, and the opening h2 is formed in the insulating portion 50 on the drain pad 237. Thus, the source pad 227 is exposed from the opening h1 while the drain pad 237 is exposed from the opening h2.

When a thickness of the sixth layer 52 is sufficiently thinner than a thickness of the fifth layer 51, an etching condition for the fifth layer 51 has only to be adjusted mainly for formation of the openings h1 and h2. Consequently, the semiconductor device 120 is completed.

In such a method for manufacturing the semiconductor device 120, the insulating portions 30, 40, and 50 provided on the semiconductor layer 10 in a plurality of layers are provided with stress relaxation layers (the second layer 32, the fourth layer 42, and the sixth layer 52). Thus, variation in the warping amount of the semiconductor layer 10 is suppressed more effectively than in a case of providing no stress relaxation layers. When variation in the warping amount of the semiconductor layer 10 is suppressed, alignment accuracy and the like when multilayered insulating portions and interconnects are formed on the semiconductor layer 10 are improved. Accordingly, manufacturing yield of the semiconductor device 120 is improved.

Third Embodiment

Figure 8:
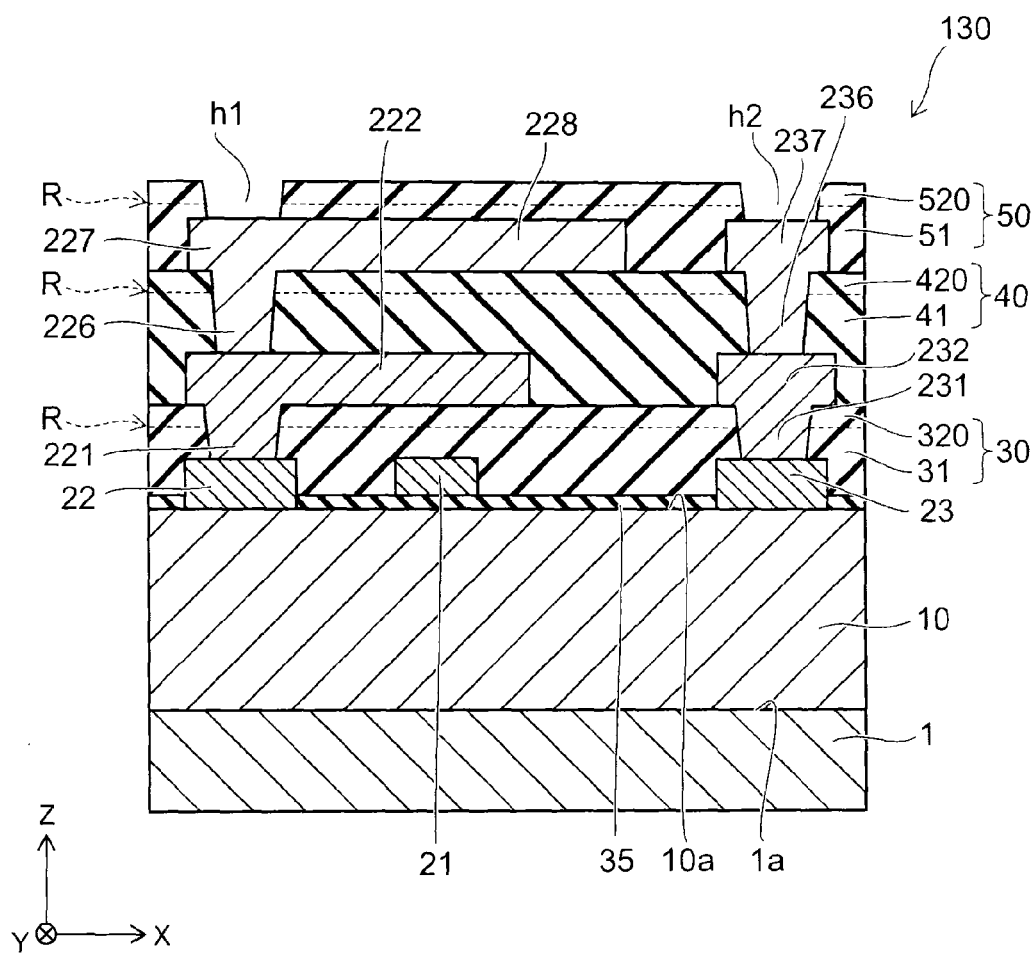
FIG. 8 is a schematic cross-sectional view illustrating the configuration of a semiconductor device according to a third embodiment.

FIG. 8 is a schematic cross-sectional view illustrating the configuration of a semiconductor device according to a third embodiment.

As shown in FIG. 8, a semiconductor device 130 according to the third embodiment differs from the semiconductor device 120 according to the second embodiment in terms of manufacturing methods of a second layer 320, a fourth layer 420, and a sixth layer 520. That is, the second layer 320, the fourth layer 420, and the sixth layer 520 of the semiconductor device 130 are formed in different manufacturing methods from those of the second layer 32, the fourth layer 42, and the sixth layer 52 of the semiconductor device 120.

The second layer 320 of the insulating portion 30 is a layer formed in the same manufacturing method as that of the first layer 31 of the insulating portion 30 and under different manufacturing conditions from those of the first layer 31 of the insulating portion 30. The fourth layer 420 of the insulating portion 40 is a layer formed in the same manufacturing method as that of the third layer 41 of the insulating portion 40 and under different manufacturing conditions from those of the third layer 41 of the insulating portion 40. The sixth layer 520 of the insulating portion 50 is a layer formed in the same manufacturing method as that of the fifth layer 51 of the insulating portion 50 and under different manufacturing conditions from those of the fifth layer 51 of the insulating portion 50.

For example, the first layer 31 of the insulating portion 30 is formed by plasma CVD. The second layer 320 of the insulating portion 30 is formed by continuous film forming from the first layer 31. In the middle of this continuous film forming, manufacturing conditions are changed. Thus, the second layer 320 is formed. Accordingly, there exists from the first layer 31 to the second layer 320 a region R in which parameters are gradually changed due to changes in manufacturing conditions such as a composition, a material for an additive, and an amount of the additive.

To form the first layer 31 to the second layer 320, a flow rate, a flow ratio, pressure, a temperature, radio frequency output, and the like of material gas for the plasma CVD are changed. Thus, the first layer 31 via the region R to the second layer 320 are formed.

The fourth layer 420 of the insulating portion 40 and the sixth layer 520 of the insulating portion 50 are similar to the second layer 320. That is, the fourth layer 420 is formed by continuous film forming from the third layer 41. By changing manufacturing conditions at this time, the third layer 41 via the region R to the fourth layer 420 are formed. The sixth layer 520 is formed by continuous film forming from the fifth layer 51. By changing manufacturing conditions at this time, the fifth layer 51 via the region R to the sixth layer 520 are formed.

In such a semiconductor device 130, similar effects to those of the semiconductor device 120 can be obtained, and additionally, the insulating portions 30, 40, and 50 can be manufactured easily.

As described above, with the embodiment, a semiconductor device in which warping of a substrate is suppressed can be provided.

Meanwhile, in the specification, the "nitride semiconductor" shall include semiconductors with all kinds of compositions having a chemical formula of $B_xIn_yAl_zGa_{1-x-y-z}N$ ($0 \leq x \leq 1$, $0 \leq y \leq 1$, $0 \leq z \leq 1$, $x+y+z \leq 1$) where composition ratios x, y, and z are changed in respective ranges. Further, the "nitride semiconductor" shall include ones having the above chemical formula further containing a Group V element other than N (nitrogen), further containing various elements to be added to control various physical properties such as a conductivity type, and further containing various elements to be contained unintentionally.

The embodiments have been described above with reference to the specific examples. However, the embodiments are not limited to these specific examples. That is, a person skilled in the art appropriately adds design changes to these specific examples, and such changes are encompassed within the scope of the embodiments as long as they have features of the embodiments. Each component included in each of the aforementioned specific examples, and arrangement, a material, a condition, a shape, a size, and the like of the component are not limited to the illustrated ones but can be changed appropriately.

Each element included in embodiments described above can be combined to the extent possible and these combinations are also encompassed within the scope of the embodiments as long as they include the features of the embodiments. Various other variations and modifications can be conceived by those skilled in the art within the spirit of the invention, and it is understood that such variations and modifications are also encompassed within the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor layer having a first surface, the first surface including a first region and a second region;
    an electrode provided on the first region; and
    an insulating portion including
        a first layer including a first part and a second part, the first part being provided on the electrode and the second part being provided on the second region, the first layer having a first internal stress along the first surface, and a second layer provided on the first part and the second part, the second layer having a second internal stress in a reverse direction of the first internal stress, a first thickness of the first part being thinner than a second thickness of the second part, the second thickness being thicker than a third thickness of the electrode, and a fourth thickness of the second layer being thinner than the first thickness and thinner than the second thickness.

2. The device according to claim 1, wherein the second internal stress is larger than the first internal stress.

3. The device according to claim 1, wherein warping of the semiconductor layer by the first layer is suppressed by the second layer.

4. The device according to claim 1, wherein a material composition of the second layer is different from a material composition of the first layer.

5. The device according to claim 1, wherein a material of the second layer is same as a material of the first layer.

6. The device according to claim 1, wherein the semiconductor layer includes a nitride semiconductor.

7. The device according to claim 1, wherein the semiconductor layer includes silicon carbide.

* * * * *